(12) United States Patent
Yang et al.

(10) Patent No.: US 12,156,444 B2
(45) Date of Patent: Nov. 26, 2024

(54) DISPLAY APPARATUS INCLUDING PAD UNIT HAVING PLURALITY OF CONDUCTIVE LAYERS WITH MULTIPLE OPENINGS

(71) Applicant: Samsung Display Co., Ltd., Yongin-si (KR)

(72) Inventors: Shinhyuk Yang, Yongin-si (KR); Donghan Kang, Yongin-si (KR); Soonwook Hong, Yongin-si (KR); Yujin Kim, Yongin-si (KR); Jeehoon Kim, Yongin-si (KR); Hanhee Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 487 days.

(21) Appl. No.: 17/447,046

(22) Filed: Sep. 7, 2021

(65) Prior Publication Data

US 2022/0181427 A1 Jun. 9, 2022

(30) Foreign Application Priority Data

Dec. 9, 2020 (KR) .......................... 10-2020-0171448

(51) Int. Cl.
*H10K 50/84* (2023.01)
*H10K 59/12* (2023.01)
(Continued)

(52) U.S. Cl.
CPC ......... *H10K 59/131* (2023.02); *H10K 50/844* (2023.02); *H10K 59/1201* (2023.02); *H10K 59/1216* (2023.02)

(58) Field of Classification Search
CPC .... H10K 50/844; H10K 59/131; H10K 59/12; H10K 59/122; H10K 59/124; H10K 59/1216; H01L 27/124
See application file for complete search history.

(56) References Cited

U.S. PATENT DOCUMENTS 6,380,992 B1 4/2002 Lee
9,178,003 B2 11/2015 Park et al.
(Continued)

FOREIGN PATENT DOCUMENTS

KR 10-0474002 B1 7/2005
KR 10-2016-0017193 A 2/2016
(Continued)

*Primary Examiner* — Ida M Soward
(74) *Attorney, Agent, or Firm* — Lewis Roca Rothgerber Christie LLP

(57) ABSTRACT

A display apparatus includes: a substrate including a display area, and a peripheral area; and a pad unit at the peripheral area, the pad unit including: a first conductive layer; a second conductive layer on the first conductive layer, and having a first opening; a third conductive layer on the second conductive layer, and having a second opening overlapping with the first opening, the second opening having an area less than an area of the first opening at a top surface of the second conductive layer; an organic protective layer filling the first opening, and having a third opening overlapping with the second opening; and an additional metal layer covering a top surface of the first conductive layer exposed through the first opening, an inner surface of the second opening, an inner surface of the third opening, and a portion of a top surface of the third conductive layer.

14 Claims, 13 Drawing Sheets

(51) Int. Cl.
*H10K 59/13* (2023.01)
*H10K 59/131* (2023.01)
*H10K 50/844* (2023.01)
*H10K 59/121* (2023.01)

(56) References Cited

U.S. PATENT DOCUMENTS

| | | | |
|---|---|---|---|
| 9,929,226 B2 | 3/2018 | Im et al. | |
| 10,162,440 B2 | 12/2018 | Jin | |
| 2005/0174503 A1* | 8/2005 | Kim | G02F 1/136286 345/87 |
| 2010/0171121 A1* | 7/2010 | Kim | H01L 27/1288 257/E33.053 |
| 2013/0119392 A1* | 5/2013 | Park | H10K 59/121 438/34 |
| 2014/0353619 A1* | 12/2014 | Park | H10K 50/844 438/34 |
| 2015/0097160 A1* | 4/2015 | Kim | H10K 59/124 438/23 |
| 2015/0108452 A1* | 4/2015 | Park | H10K 59/131 257/40 |
| 2016/0104858 A1* | 4/2016 | You | H10K 59/1213 257/40 |
| 2017/0040347 A1* | 2/2017 | Seo | H10K 50/8426 |
| 2018/0342707 A1* | 11/2018 | Lee | H10K 77/111 |
| 2019/0221618 A1* | 7/2019 | Nagata | H10K 59/00 |
| 2020/0096812 A1* | 3/2020 | Hinata | G02F 1/133528 |
| 2020/0335725 A1* | 10/2020 | Maruyama | H05B 33/10 |
| 2020/0365681 A1* | 11/2020 | Gunji | H05B 33/06 |
| 2024/0049501 A1* | 2/2024 | Suzuki | H10K 50/8426 |

FOREIGN PATENT DOCUMENTS

| | | |
|---|---|---|
| KR | 10-1879180 B1 | 7/2018 |
| KR | 10-1948173 B1 | 2/2019 |
| KR | 10-2131963 B1 | 7/2020 |

* cited by examiner

DISPLAY APPARATUS INCLUDING PAD UNIT HAVING PLURALITY OF CONDUCTIVE LAYERS WITH MULTIPLE OPENINGS

CROSS-REFERENCE TO RELATED APPLICATION

This application claims priority to and the benefit of Korean Patent Application No. 10-2020-0171448, filed on Dec. 9, 2020, in the Korean Intellectual Property Office, the entire content of which is hereby incorporated by reference.

BACKGROUND

1. Field

Aspects of one or more embodiments relate to a display apparatus, and a method of manufacturing the same, and more particularly, to a display apparatus including a pad unit having reduced defects, and a method of manufacturing the display apparatus.

2. Description of the Related Art

From among various display apparatuses, organic light-emitting display apparatuses are noted as next-generation display apparatuses due to having wide viewing angles, high contrast, and fast response times.

In general, an organic light-emitting display apparatus includes a thin-film transistor and organic light-emitting diodes (OLEDs) that are formed on a substrate, and the OLEDs emit light by themselves (e.g., are self-emissive). An organic light-emitting display apparatus may be used as a display for a small product, for example, such as a mobile phone, or may be used as a display for a large product, for example, such as a television.

The above information disclosed in this Background section is for enhancement of understanding of the background of the present disclosure, and therefore, it may contain information that does not constitute prior art.

SUMMARY

In comparative display apparatuses, and methods of manufacturing the comparative display apparatuses, a part of a wiring included in a pad unit may be damaged (e.g., may be disconnected) during a subsequent process after the pad unit is formed in a manufacturing process, thereby resulting in defects.

One or more embodiments of the present disclosure are directed to a display apparatus including a pad unit (e.g., a pad terminal) having reduced defects, and a method of manufacturing the display apparatus. However, the present disclosure is not limited to the above aspects and features.

Additional aspects and features will be set forth, in part, in the description which follows, and in part, will be apparent from the description, or may be learned by practicing one or more of the presented embodiments of the present disclosure.

According to one or more embodiments of the present disclosure, a display apparatus includes: a substrate including a display area, and a peripheral area; and a pad unit at the peripheral area, the pad unit including: a first conductive layer; a second conductive layer on the first conductive layer, and having a first opening; a third conductive layer on the second conductive layer, and having a second opening overlapping with the first opening, the second opening having an area less than an area of the first opening at a top surface of the second conductive layer; an organic protective layer filling the first opening, and having a third opening overlapping with the second opening; and an additional metal layer covering a top surface of the first conductive layer exposed through the first opening, an inner surface of the second opening, an inner surface of the third opening, and a portion of a top surface of the third conductive layer.

In an embodiment, the inner surface of the second opening may protrude farther toward a center of the second opening than an inner surface of the first opening.

In an embodiment, the pad unit may further include a delay film between the organic protective layer and the second conductive layer.

In an embodiment, the delay film may include a combination of sulfur and a metal included in the second conductive layer.

In an embodiment, the second conductive layer may include copper, and the delay film may include copper sulfide.

In an embodiment, the first conductive layer, the second conductive layer, and the third conductive layer may extend in one direction.

In an embodiment, an outer edge of the first conductive layer, an outer edge of the second conductive layer, and an outer edge of the third conductive layer may be aligned with one another.

In an embodiment, the display apparatus may further include a plurality of thin-film transistors at the display area, each of the plurality of thin-film transistors including a source electrode, and a drain electrode. Each of the source electrode and the drain electrode may include a first layer including a same material as a material of the first conductive layer, a second layer including a same material as a material of the second conductive layer, and a third layer including a same material as a material of the third conductive layer.

In an embodiment, the first conductive layer may include titanium, the second conductive layer may include copper, and the third conductive layer may include indium tin oxide (ITO).

In an embodiment, no stepped portion may be between the inner surface of the second opening and the inner surface of the third opening.

In an embodiment, the display apparatus may further include: a pixel electrode at the display area; and an upper insulating layer on the pixel electrode, and having a pixel opening exposing a central portion of the pixel electrode, and a fourth opening overlapping with the first opening.

In an embodiment, the organic protective layer may include a same material as a material of the upper insulating layer.

In an embodiment, the additional metal layer may electrically connect a portion of the second conductive layer located at one side of the first opening to a portion of the second conductive layer located at another side of the first opening.

In an embodiment, the additional metal layer may include silver or tungsten.

According to one or more embodiments of the present disclosure, a method of manufacturing a display apparatus, includes: forming a plurality of thin-film transistors at a display area of a substrate; forming a pad unit at a peripheral area of the substrate, the pad unit comprising a first conductive layer, a second conductive layer, and a third conductive layer; forming a pixel electrode material layer over the thin-film transistors; forming a pixel electrode by patterning the pixel electrode material layer to form a first opening in a part of the second conductive layer, and a second opening overlapping with the first opening in a part of the third conductive layer; forming an organic material layer over the pad unit to fill the first opening; forming an upper insulating layer on the pixel electrode, the upper insulating layer having a pixel opening exposing a central portion of the pixel electrode, and a fourth opening overlapping with the first opening; forming an organic protective layer filling the first opening by patterning the organic material layer, the organic protective layer having a third opening overlapping with the first opening; and forming an additional metal layer covering a top surface of the first conductive layer exposed through the first opening, an inner surface of the second opening, an inner surface of the third opening, and a portion of a top surface of the third conductive layer.

In an embodiment, the method may further include forming a delay film at a contact portion between the organic protective layer and the second conductive layer by a reaction of the organic protective layer and the second conductive layer to each other.

In an embodiment, the delay film may include a combination of sulfur and a metal included in the second conductive layer.

In an embodiment, the second conductive layer may include copper, and the delay film may include copper sulfide.

In an embodiment, each of the plurality of thin-film transistors may include a source electrode, and a drain electrode, and each of the source electrode and the drain electrode may include a first layer including a same material as a material of the first conductive layer, a second layer including a same material as a material of the second conductive layer, and a third layer including a same material as a material of the third conductive layer.

In an embodiment, the first conductive layer may include titanium, the second conductive layer may include copper, and the third conductive layer may include indium tin oxide (ITO).

In an embodiment, no stepped portion may be between the inner surface of the second opening and the inner surface of the third opening.

In an embodiment, the additional metal layer may electrically connect a portion of the second conductive layer located at one side of the first opening to a portion of the second conductive layer located at another side of the first opening.

In an embodiment, the additional metal layer may include silver or tungsten.

Other aspects and features of the present disclosure will become more apparent from the detailed description, the drawings, and the claims and their equivalents.

The above and other embodiments of the present disclosure may be implemented by using a system, a method, a computer program, or a combination thereof.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which.

DETAILED DESCRIPTION

Figure 1:
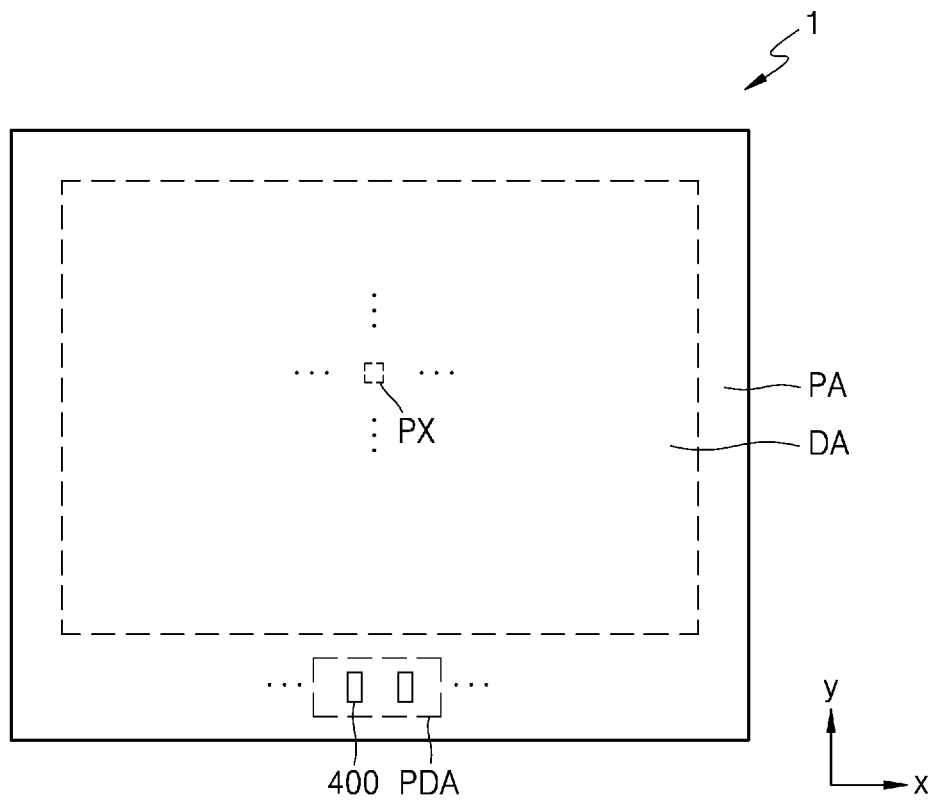
FIG. 1 is a plan view illustrating a part of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expressions "at least one of a, b, or c" and "at least one of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
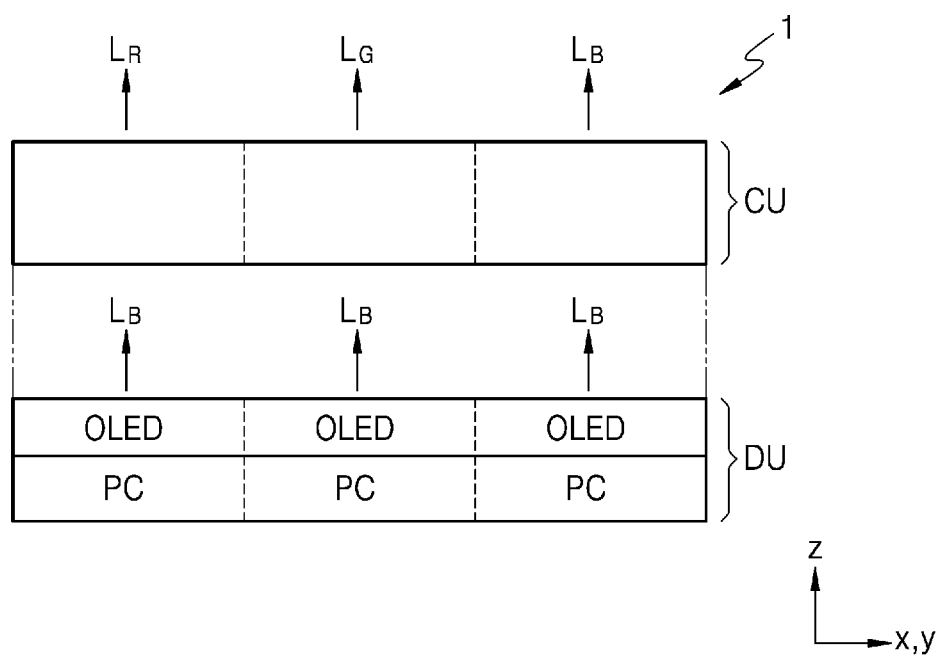
FIG. 2 is a cross-sectional view illustrating a part of the display apparatus according to an embodiment.

FIG. 1 is a plan view of a part of a display apparatus according to an embodiment. FIG. 2 is a cross-sectional view of a part of the display apparatus according to an embodiment.

As shown in FIG. 1, a display apparatus 1 according to an embodiment may include a display area DA where light is emitted, and a peripheral area PA where light is not emitted. A substrate 100 (e.g., see FIG. 5) of the display apparatus 1 may include a portion corresponding to the display area DA, and a portion corresponding to the peripheral area PA.

A plurality of pixels PX may be located at (e.g., in or on) the display area DA. Each of the pixels PX may include a pixel circuit PC connected to a corresponding scan line and a corresponding data line, and a light-emitting diode electrically connected to the pixel circuit PC. Although the display area DA of the display apparatus 1 shown in FIG. 1 has having a quadrangular shape, the present disclosure is not limited thereto, and the display area DA may have any suitable shape, for example, such as a circular shape, an elliptical shape, a polygonal shape, and/or the like.

The peripheral area PA is a non-display area where the pixels PX are not located. The peripheral area PA may surround (e.g., around a periphery of) at least a part of the display area DA. For example, the peripheral area PA may entirely surround (e.g., around a periphery of) the display area DA. Various wirings for applying electrical signals to the display area DA may be located at (e.g., in or on) the peripheral area PA. Also, a part of a circuit unit (e.g., a driver or a driving circuit) for controlling an electrical signal applied into the display area DA may be located at (e.g., in or on) the peripheral area PA.

The peripheral area PA may include a pad area PDA at (e.g., in or on) a portion thereof. A plurality of pad units (e.g., pad terminals) 400 may be located at (e.g., in or on) the pad area PDA. The plurality of pad units 400 may be electrically connected to pads, respectively, of a printed circuit board to receive signals input through the printed circuit board. The plurality of pad units 400 may be exposed without being covered by an insulating layer, and may be electrically connected to the printed circuit board or the like.

Hereinafter, for convenience, the display apparatus 1 according to an embodiment is described in more detail as an organic light-emitting display apparatus. However, the present disclosure is not limited thereto. In other words, the display apparatus 1 may be any suitable display apparatus, for example, such as an inorganic light-emitting display, or a quantum dot light-emitting display. For example, an emission layer of a display device included in the display apparatus 1 may include an organic material or an inorganic material. The display apparatus 1 may include quantum dots, an organic material and quantum dots, or an inorganic material and quantum dots.

In an embodiment, the display apparatus 1 may include a color filter unit (e.g., a color filter layer) CU and a display unit (e.g., a display layer or a display panel) DU that are stacked together as a stacked unit. The display unit DU may include a plurality of light-emitting diodes, and each of the light-emitting diodes may be electrically connected to a corresponding pixel circuit PC. The light-emitting diodes and the pixel circuits PCs may be located at (e.g., in or on) the display area DA.

In an embodiment, as shown in FIG. 2, the light-emitting diode may be an organic light-emitting diode OLED including an organic emission layer. In another embodiment, the light-emitting diode may be an inorganic light-emitting diode including an inorganic material. The inorganic light-emitting diode may include a PN diode including inorganic semiconductor-based materials. When a voltage is applied to a PN junction diode in a forward direction, holes and electrons may be injected, and energy generated by recombination of the holes and electrons may be converted into light energy to emit light of a desired color (e.g., a predetermined or certain color). The inorganic light-emitting diode may have a width of several to hundreds of micrometers. In another embodiment, the light-emitting diode may include quantum dots as an emission layer. For convenience of description, the light-emitting diode may be described in more detail hereinafter as an organic light-emitting diode OLED.

As shown in FIG. 2, the display area DA may provide an image (e.g., a predetermined or certain image) by using blue light $L_B$ of the organic light-emitting diodes OLEDs. In an embodiment, while passing through the color filter unit CU, blue light $L_B$ emitted by the organic light-emitting diodes OLEDs may be converted into red light $L_R$ and green light $L_G$, or may be transmitted through the color filter unit CU as blue light $L_B$ without being converted. The display apparatus 1 may provide the image by using the light that is converted or not converted by the color filter unit CU, for example, by using the red light $L_R$, the green light $L_G$, and the blue light $L_B$.

The peripheral area PA is a non-display area where the pixels PX are not located. The plurality of pad units 400 may be located at (e.g., in or on) the peripheral area PA. The pad units 400 may be located at (e.g., in or on) the peripheral area PA to be spaced apart from one another. The pad unit 400 may be electrically connected to a printed circuit board or an integrated circuit device. The pad unit 400 may be provided at (e.g., in or on) the display unit DU.

Figure 3:
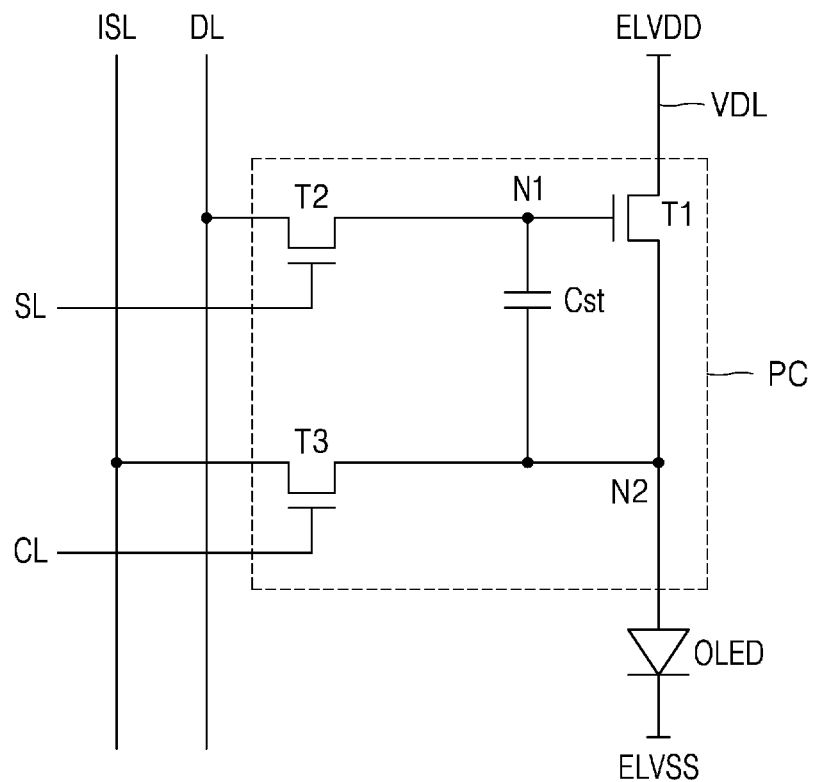
FIG. 3 is an equivalent circuit diagram illustrating a light-emitting diode and a pixel circuit connected to the light-emitting diode in a display apparatus according to an embodiment.

FIG. 3 is an equivalent circuit diagram illustrating a light-emitting diode and a pixel circuit connected to the light-emitting diode in a display apparatus according to an embodiment.

Referring to FIG. 3, a display apparatus according to an embodiment may include an organic light-emitting diode OLED as the light-emitting diode. The organic light-emitting diode OLED may be electrically connected to the pixel circuit PC including a plurality of thin-film transistors and a capacitor.

The pixel circuit PC may include a first thin-film transistor T1, a second thin-film transistor T2, a third thin-film transistor T3, and a storage capacitor Cst.

Each of the first thin-film transistor T1, the second thin-film transistor T2, and the third thin-film transistor T3 may be an oxide semiconductor thin-film transistor including a semiconductor layer formed of an oxide semiconductor, or may be a silicon semiconductor thin-film transistor including a semiconductor layer formed of polysilicon. According to a type of the thin-film transistor, a first electrode may be one of a source electrode and a drain electrode, and a second electrode may be the other remaining one of the source electrode and the drain electrode.

The first thin-film transistor T1 may be a driving thin-film transistor. A first electrode of the first thin-film transistor T1 may be connected to a driving voltage line VDL that supplies a driving power supply voltage ELVDD, and a second electrode of the first thin-film transistor T1 may be connected to a pixel electrode of the organic light-emitting diode OLED. A gate electrode of the first thin-film transistor T1 may be connected to a first node N1. The first thin-film transistor T1 may control an amount of current flowing through the organic light-emitting diode OLED from the driving voltage line VDL in response to a voltage of the first node N1.

The second thin-film transistor T2 may be a switching thin-film transistor. A first electrode of the second thin-film transistor T2 may be connected to a data line DL, and a second electrode of the second thin-film transistor T2 may be connected to the first node N1. A gate electrode of the second thin-film transistor T2 may be connected to a scan line SL. The second thin-film transistor T2 may be turned on when a scan signal is applied to the scan line SL, to electrically connect the data line DL to the first node N1.

The third thin-film transistor T3 may be an initialization thin-film transistor and/or a sensing thin-film transistor. A first electrode of the third thin-film transistor T3 may be connected to a second node N2, and a second electrode of the third thin-film transistor T3 may be connected to an initialization-sensing line ISL. A gate electrode of the third thin-film transistor T3 may be connected to a control line CL.

The third thin-film transistor T3 may be turned on when a control signal is applied to the control line CL, to electrically connect the initialization-sensing line ISL to the second node N2. In some embodiments, the third thin-film transistor T3 may be turned on according to a signal received through the control line CL, to initialize the pixel electrode of the organic light-emitting diode OLED by using an initialization voltage from the initialization-sensing line ISL. In some embodiments, the third thin-film transistor T3 may be turned on when a control signal is applied to the control line CL, to sense characteristic information of the organic light-emitting diode OLED. The third thin-film transistor T3 may function as both an initialization thin-film transistor and a sensing thin-film transistor, or may function as one of the initialization thin-film transistor and the sensing thin-film transistor. In some embodiments, when the third thin-film transistor T3 functions as the initialization thin-film transistor, the initialization-sensing line ISL may be referred to as an initialization voltage line, and when the third thin-film transistor T3 functions as the sensing thin-film transistor, the initialization-sensing line ISL may be referred to as a sensing line. An initialization operation and a sensing operation of the third thin-film transistor T3 may be individually performed, or may be concurrently (e.g., simultaneously) performed. In other words, the third thin-film transistor T3 may be an initialization thin-film transistor and/or a sensing thin-film transistor.

The storage capacitor Cst may be connected between the first node N1 and the second node N2. For example, a first electrode of the storage capacitor Cst may be connected to the gate electrode of the first thin-film transistor T1, and a second electrode of the storage capacitor Cst may be connected to the pixel electrode of the organic light-emitting diode OLED. A common power supply voltage ELVSS may be supplied to a counter electrode 530 of the organic light-emitting diode OLED (see FIG. 5).

Although the pixel circuit PC is shown in FIG. 3 as including three thin-film transistors and one storage capacitor, the present disclosure is not limited thereto, and in other embodiments, the number of thin-film transistors and/or the number of storage capacitors may be variously modified according to a design of the pixel circuit PC.

Figure 4:
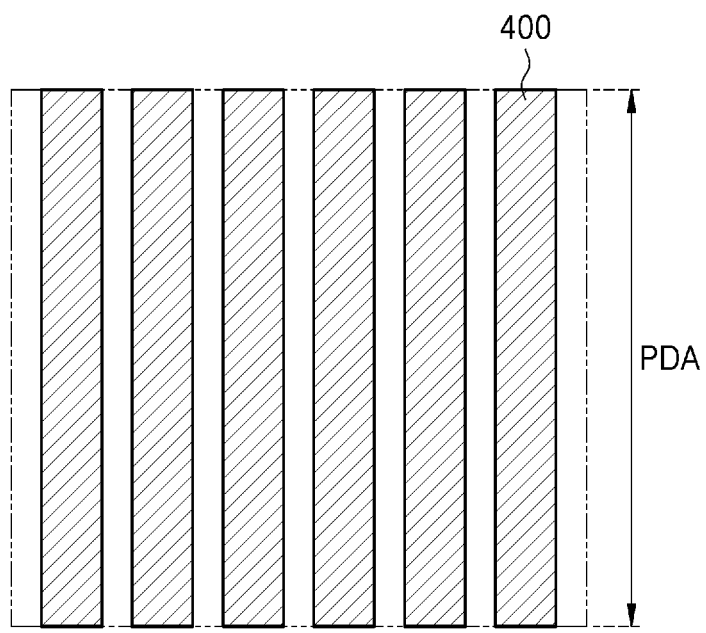
FIG. 4 is an enlarged plan view illustrating a part of a pad area of FIG. 1.

FIG. 4 is an enlarged plan view illustrating a part of the pad area PDA of FIG. 1.

Referring to FIG. 4, the plurality of pad units 400 may be located at (e.g., in or on) the pad area PDA. The pad units 400 may extend in one direction. In an embodiment, one ends of the pad units 400 may be electrically connected to pad electrodes, and the other ends of the pad units 400 may be electrically connected to signal lines located at (e.g., in or on) the display area. Accordingly, the pad units 400 may electrically connect the pad electrodes to the signal lines located at (e.g., in or on) the display area, for example, such as to the data lines (or the scan lines).

Figure 5:
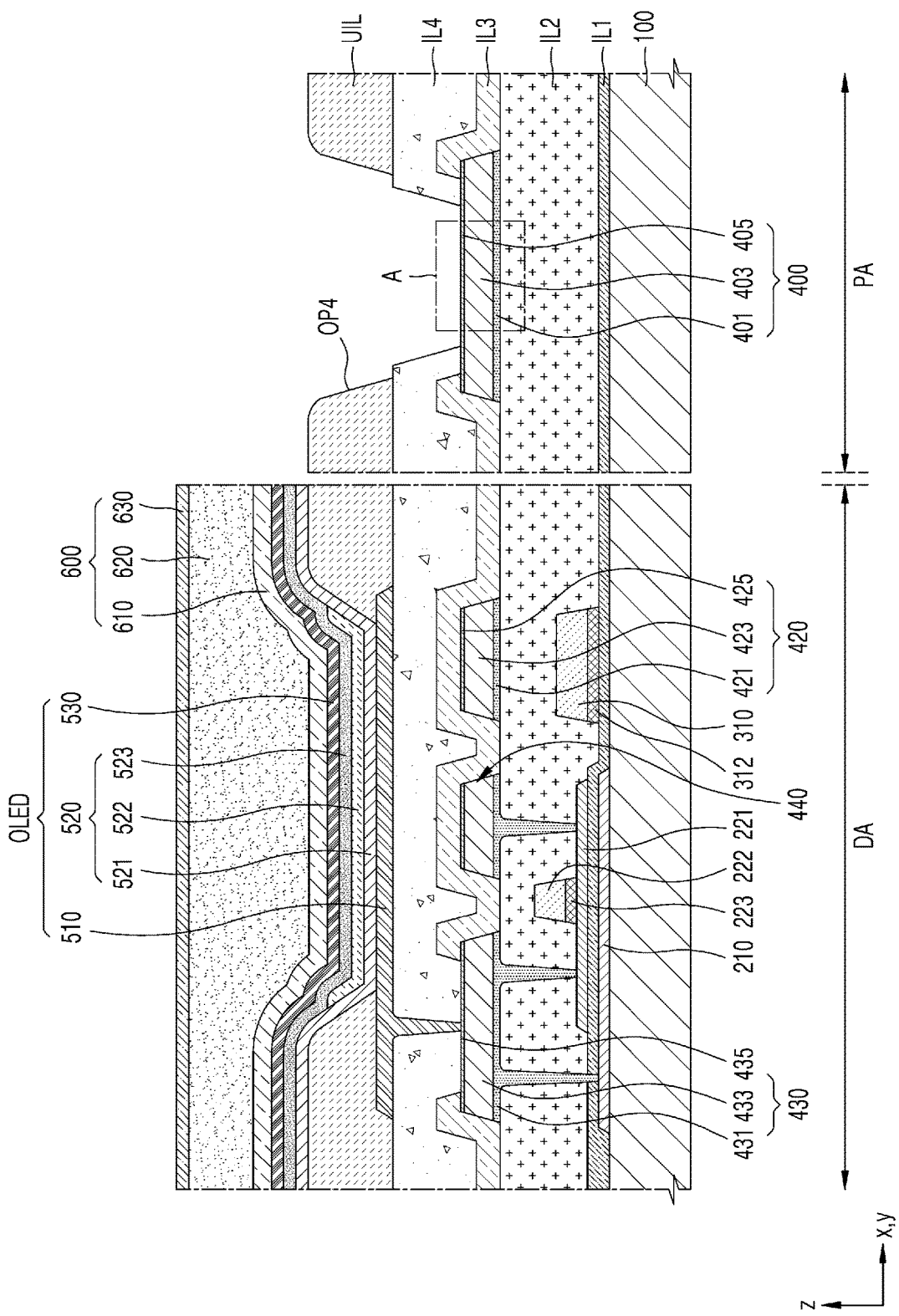
FIG. 5 is a cross-sectional view illustrating a part of a display apparatus according to an embodiment.
Figure 6:
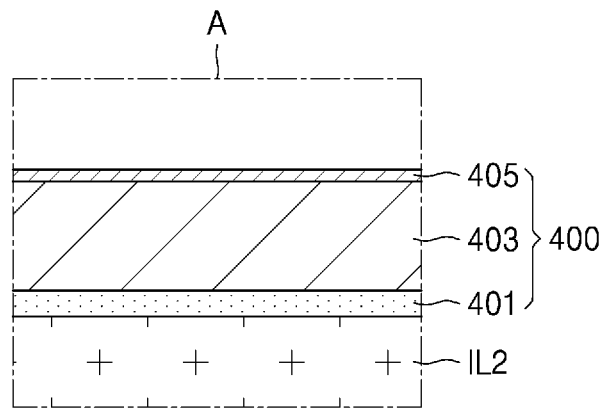
FIG. 6 is an enlarged cross-sectional view illustrating the portion A of FIG. 5.

FIG. 5 is a cross-sectional view illustrating a part of a display apparatus according to an embodiment. FIG. 6 is an enlarged cross-sectional view illustrating the portion A of FIG. 5.

As shown in FIG. 5, the display apparatus according to an embodiment may include the substrate 100, an organic light-emitting diode OLED located at (e.g., in or on) the display area DA, a thin-film transistor electrically connected to the organic light-emitting diode OLED, and the pad unit 400 located at (e.g., in or on) the peripheral area PA.

The substrate 100 may include glass, a metal, or a polymer resin. When the substrate 100 is flexible or bendable, the substrate 100 may include a polymer resin, for example, such as a polyethersulfone, polyacrylate, polyetherimide, polyethylene naphthalate, polyethylene terephthalate, polyphenylene sulfide, polyarylate, polyimide, polycarbonate, or cellulose acetate propionate. However, the present disclosure is not limited thereto, and various suitable modifications may be made. For example, the substrate 100 may have a multi-layered structure including two or more layers, each including a polymer resin, and a barrier layer including an inorganic material (e.g., silicon oxide, silicon nitride, or silicon oxynitride) between the two or more layers.

At (e.g., in or on) the display area DA, the thin-film transistor may be located on the substrate 100, and the organic light-emitting diode OLED that is electrically connected to the thin-film transistor may be located on the thin-film transistor. When the thin-film transistor and the organic light-emitting diode OLED are electrically connected to each other, the thin-film transistor and a pixel electrode 510 of the organic light-emitting diode OLED may be connected to each other.

The thin-film transistor may include a semiconductor layer 221, a gate electrode 222 overlapping with a channel region of the semiconductor layer 221, and a source electrode 430 and a drain electrode 440 connected to a source region and a drain region, respectively, of the semiconductor layer 221. Also, a storage capacitor may include a first electrode 310 and a second electrode 420.

The semiconductor layer 221 of the thin-film transistor may include an oxide semiconductor. The oxide semiconductor may include indium gallium zinc oxide (IGZO), zinc tin oxide (ZTO), or zinc indium oxide (ZIO). In another embodiment, the semiconductor layer 221 may include polysilicon, amorphous silicon, or an organic semiconductor.

The gate electrode 222 of the thin-film transistor may overlap with the channel region of the semiconductor layer 221, with a gate insulating layer 223 therebetween. The gate insulating layer 223 and the gate electrode 222 may be formed by using the same mask process, and may have the same or substantially the same planar shape as each other. The gate electrode 222 may include a conductive material including molybdenum (Mo), aluminum (Al), copper (Cu), or titanium (Ti), and may have a single-layer structure or a multi-layered structure including one or more of the above materials. In some embodiments, the gate electrode 222 may have a multi-layered structure including a metal layer including one or more of the above metal elements, and a transparent conductive oxide layer, for example, such as ITO, on the metal layer. Also, the gate insulating layer 223 may include an inorganic material, for example, such as silicon oxide, silicon nitride, and/or silicon oxynitride.

The first electrode 310 of the storage capacitor and the gate electrode 222 may be formed by using the same process, and may include the same material as each other. An insulating layer 312 including the same material as that of the gate insulating layer 223 may be located under (e.g., underneath) the first electrode 310. Because the insulating layer 312, which is located under (e.g., underneath) the first electrode 310, and the first electrode 310 may be formed by using the same mask process, the insulating layer 312 and the first electrode 310 may have the same or substantially the same planar shape as each other.

The source electrode 430 and the drain electrode 440 of the thin-film transistor and/or the second electrode 420 of the storage capacitor may be formed together in a patterning process for forming the pad unit 400. Accordingly, the source electrode 430 and the drain electrode 440 of the thin-film transistor and the second electrode 420 of the storage capacitor may have the same multi-layered structure as that of the pad unit 400.

The thin-film transistor may include a lower electrode 210 located under (e.g., underneath) the semiconductor layer 221, and the lower electrode 210 may be electrically connected to one of the source electrode 430 and the drain electrode 440. In an embodiment, as shown in FIG. 5, the lower electrode 210 may be electrically connected to the source electrode 430, and the lower electrode 210 may be a lower source electrode 210.

The lower electrode 210 may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), and/or copper (Cu). In some embodiments, the lower electrode 210 may have a multi-layered structure including a metal layer including one or more of the above metal elements, and a transparent conductive oxide layer, for example, such as ITO, on the metal layer. The lower electrode 210 may improve the characteristics of the thin-film transistor.

A first insulating layer IL1 may be located between the substrate 100 and the thin-film transistor having the above described structure. A second insulating layer IL2 may be located on the first insulating layer IL1, and a third insulating layer IL3 may be located on the second insulating layer IL2. The first insulating layer IL1 may planarize or substantially planarize a top surface of the substrate 100, or may prevent or minimize impurities from the substrate 100 or the like from penetrating into the semiconductor layer 221 of the thin-film transistor. The first insulating layer IL1 may cover a top surface of the lower electrode 210, and may be located between the lower electrode 210 and the semiconductor layer 221. The second insulating layer IL2 may cover a top surface of each of the gate electrode 222 and the first electrode 310, and may be located under (e.g., underneath) the source electrode 430, the drain electrode 440, the second electrode 420, and the pad unit 400. The third insulating layer IL3 may cover at least a part of a top surface of each of the source electrode 430, the drain electrode 440, the second electrode 420, and the pad unit 400, and may be located under (e.g., underneath) the pixel electrode 510. Each of the first through third insulating layers IL1, IL2, and IL3 may include an inorganic material, for example, such as silicon oxide, silicon nitride, and/or silicon oxynitride.

A fourth insulating layer IL4 may be located on the third insulating layer IL3. The fourth insulating layer IL4 may be a planarization insulating layer, and may include an organic insulating material. The organic insulating material may include a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The thin-film transistor may be electrically connected to the pixel electrode 510 located on the fourth insulating layer IL4. In an embodiment, as shown in FIG. 5, the pixel electrode 510 may be connected to the source electrode 430 or the drain electrode 440 of the thin-film transistor through a contact hole formed in the fourth insulating layer IL4.

The pixel electrode 510 may include a transparent conductive oxide, for example, such as indium tin oxide (ITO), indium zinc oxide (IZO), zinc oxide (ZnO), indium oxide (In$_2$O$_3$), indium gallium oxide (IGO), or aluminum zinc oxide (AZO). In another embodiment, the pixel electrode 510 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 510 may further include a film formed of ITO, IZO, ZnO, or In$_2$O$_3$ over/under the reflective film. For example, the pixel electrode 510 may have a three-layered structure in which an ITO layer, a silver (Ag) layer, and an ITO layer are stacked on one another.

An upper insulating layer UIL may be located on the fourth insulating layer IL4. The upper insulating layer UIL may have a pixel opening corresponding to each pixel, and a fourth opening OP4 corresponding to each pad unit 400. The pixel opening of the upper insulating layer UIL may be an opening through which a central portion of the pixel electrode 510 is exposed, and the upper insulating layer UIL may define a pixel through the pixel opening. Also, the upper insulating layer UIL may increase a distance between an edge of the pixel electrode 510 and a counter electrode 530, thereby preventing or substantially prevented an arc or the like from occurring at the edge of the pixel electrode 510. The upper insulating layer UIL may include an organic material, for example, such as polyimide or hexamethyldisiloxane (HMDSO).

An intermediate layer 520 includes an emission layer 522 overlapping with the pixel electrode 510. The intermediate layer 520 may include a first functional layer 521 located under (e.g., underneath) the emission layer 522, and/or a second functional layer 523 located over the emission layer 522.

The first functional layer 521 may have a single-layer structure or a multi-layered structure. For example, when the first functional layer 521 is formed of a high molecular weight material, the first functional layer 521 may include a hole transport layer (HTL) having a single-layer structure, and may be formed of poly-(3,4)-ethylene-dihydroxythiophene (PEDOT) or polyaniline (PANI). When the first functional layer 521 is formed of a low molecular weight material, the first functional layer 521 may include a hole injection layer (HIL) and a hole transport layer (HTL).

The emission layer 522 may include a high molecular weight organic material or a low molecular weight organic material for emitting light of a suitable color (e.g., a predetermined or certain color). The second functional layer 523 may include an electron transport layer (ETL) and/or an electron injection layer (EIL). As shown in FIG. 5, although the emission layer 522 includes a layer patterned to correspond to each pixel electrode 510, the present disclosure is not limited thereto, and the emission layer 522 may include an integrated layer over the pixel electrodes 510 as desired or necessary.

The counter electrode 530 may be formed of a conductive material having a low work function. For example, the counter electrode 530 may include a transparent or semi-transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. As another example, the counter electrode 530 may further include a layer formed of ITO, IZO, ZnO, or In$_2$O$_3$ on the transparent or semi-transparent layer including one or more of the above materials.

Because the organic light-emitting diode OLED having the multi-layered structure including the pixel electrode 510, the intermediate layer 520, and the counter electrode 530 may be damaged (e.g., may be easily damaged) by moisture and/or oxygen from the outside, the organic light-emitting diode OLED may be covered and protected by an encapsulation layer 600. The encapsulation layer 600 may include at least one inorganic encapsulation layer, and at least one organic encapsulation layer. In an embodiment, the encapsulation layer 600 may include a first inorganic encapsulation layer 610, an organic encapsulation layer 620, and a second inorganic encapsulation layer 630, which are sequentially stacked.

Each of the first inorganic encapsulation layer 610 and the second inorganic encapsulation layer 630 may include at least one inorganic insulating material. The inorganic insulating material may include aluminum oxide, tantalum oxide, hafnium oxide, zinc oxide, silicon oxide, silicon nitride, and/or silicon oxynitride. The organic encapsulation layer 620 may include a polymer-based material. Examples of the polymer-based material may include an acrylic resin, an epoxy resin, polyimide, and/or polyethylene. Examples of the acrylic resin may include polymethyl methacrylate and/or polyacrylic acid.

The pad unit 400 may be located on the substrate 100 at (e.g., in or on) the peripheral area PA. The third insulating layer IL3, the fourth insulating layer IL4, and the upper insulating layer UIL may overlap with one another, and may have openings through which a top surface of the pad unit 400 is exposed. The top surface of the pad unit 400 may be exposed to the outside through the openings. A printed circuit board or an integrated circuit device may be electrically connected to the exposed top surface of the pad unit 400.

The pad unit 400 may include a first conductive layer 401 located at (e.g., in or on) the peripheral area PA of the substrate 100, a second conductive layer 403 located on the first conductive layer 401, and a third conductive layer 405 located on the second conductive layer 403. In other words, the pad unit 400 may be located at (e.g., in or on) the peripheral area PA, and may include the first conductive layer 401, the second conductive layer 403, and the third conductive layer 405 that are sequentially stacked. As described above with reference to FIG. 4, the first through third conductive layers 401, 403, and 405 may extend in one direction. Also, the first through third conductive layers 401, 403, and 405 may be patterned in one process to have the same or substantially the same pattern as each other. In this case, an outer edge of the first conductive layer 401, an outer edge of the second conductive layer 403, and an outer edge of the third conductive layer 405 may be aligned with one another.

The pad unit 400 may be concurrently (e.g., simultaneously) patterned in one process with the source electrode 430 and the drain electrode 440 of the thin-film transistor, and/or with the second electrode 420 of the storage capacitor. Accordingly, the pad unit 400, the source electrode 430, the drain electrode 440, and/or the second electrode 420 may have the same or substantially the same layer structure as each other, and may include the same material as each other.

In an embodiment, each of the source electrode 430, the drain electrode 440, and the second electrode 420 may include a first layer including the same material as a material of the first conductive layer 401, a second layer located on the first layer and including the same material as a material of the second conductive layer 403, and a third layer located on the second layer and including the same material as a material of the third conductive layer 405. In more detail, as shown in FIG. 5, first through third layers 421, 423, and 425 of the second electrode 420, first through third layers 431, 433, and 435 of the source electrode 430, and first through third layers of the drain electrode 440 may include the same materials as the materials of the first through third conductive layers 401, 403, and 405 of the pad unit 400. For example, the first layer 431 of the source electrode 430 of the thin-film transistor and the first conductive layer 401 of the pad unit 400 may include the same material as each other, the second layer 433 of the source electrode 430 and the second conductive layer 403 of the pad unit 400 may include the same material as each other, and the third layer 435 of the source electrode 430 and the third conductive layer 405 of the pad unit 400 may include the same material as each other.

The second conductive layer 403 of the pad unit 400 may include copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and/or molybdenum (Mo) considering a suitable conductivity and/or the like thereof. The second conductive layer 403 may have a single-layer structure or a multi-layered structure including one or more of the above materials. For example, the second conductive layer 403 may include copper (Cu), and in an embodiment, the second conductive layer 403 may be a single layer formed of copper.

The first conductive layer 401 of the pad unit 400 may be located on a bottom surface of the second conductive layer 403, and may improve an adhesive force between the pad unit 400 and a layer (e.g., the second insulating layer IL2) under (e.g., underneath) the pad unit 400. The first conductive layer 401 may include a different material from that of the second conductive layer 403. For example, the first conductive layer 401 may include a metal, such as titanium (Ti), considering a desired conductivity and an adhesive force, and in an embodiment, the first conductive layer 401 may be a single layer formed of titanium. In another embodiment, the first conductive layer 401 may include a transparent conductive oxide, for example, such as indium zinc oxide (IZO), gallium zinc oxide (GZO), and/or zinc indium oxide (ZIO), and the transparent conductive oxide may be amorphous or crystalline.

The third conductive layer 405 of the pad unit 400 may be located on a top surface of the second conductive layer 403. The third conductive layer 405 may prevent or substantially prevent damage to the second conductive layer 403 in an etching process or the like included in a process of manufacturing the display apparatus. For example, in order to prevent or substantially prevent the second conductive layer 403 from being damaged by an etchant used in the etching process of the pixel electrode 510 of the light-emitting diode of the display apparatus, the third conductive layer 405 may be located on the second conductive layer 403.

The third conductive layer 405 may include a conductive material for protecting the second conductive layer 403, for example, such as a transparent conductive oxide (TCO). In some embodiments, the third conductive layer 405 may include an amorphous transparent conductive oxide. The amorphous transparent conductive oxide may include a partially crystallized amorphous transparent conductive oxide. In an embodiment, the third conductive layer 405 may include indium tin oxide (ITO).

Figure 7A:
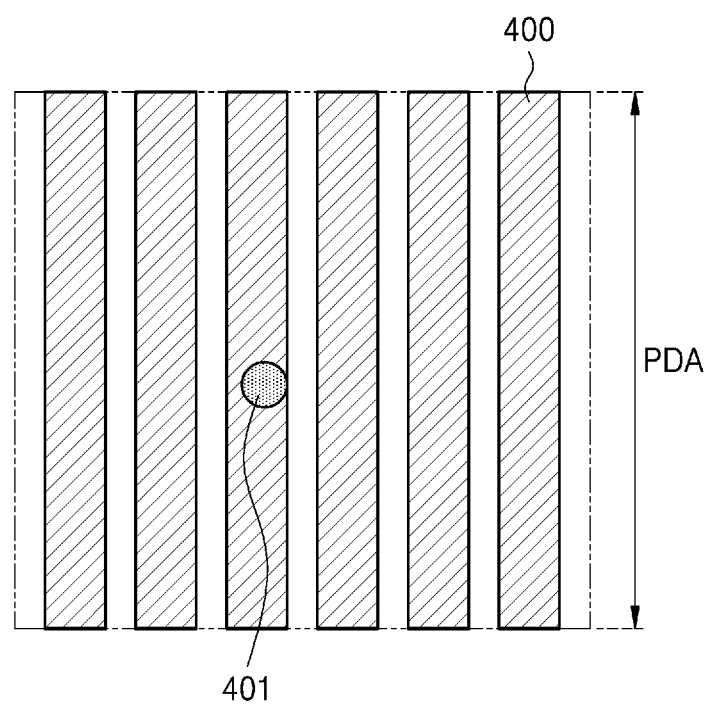
FIG. 7A is a plan view illustrating a state where a portion of a pad unit is damaged.
Figure 7B:
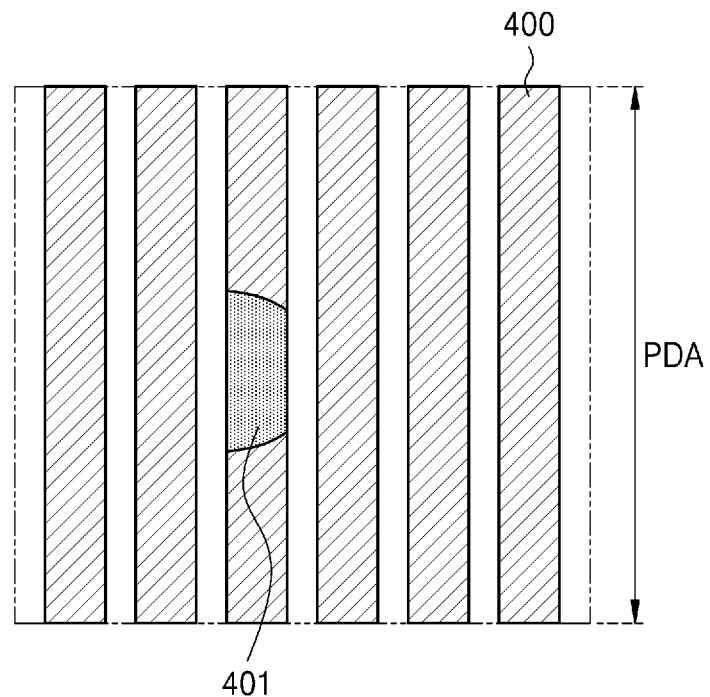
FIG. 7B is a plan view illustrating a state where a damaged portion of the pad unit of FIG. 7A is extended.

FIG. 7A is a plan view illustrating a state where a portion of a pad unit is damaged. FIG. 7B is a plan view illustrating a state where a damaged portion of the pad unit of FIG. 7A is extended.

The third conductive layer 405 may be formed through a sputtering process. The third conductive layer 405 formed through the sputtering process may have some pinholes. Also, when a thermal process is performed during a process of manufacturing the display apparatus, the third conductive layer 405 may be crystalized by the thermal process to have some pinholes according to a material included in the third conductive layer 405. Indium tin oxide (ITO) may be crystalized by a thermal process that may be included in a process of manufacturing the display apparatus. The crystalized ITO may have some pinholes due to the crystallization, and the pinhole may act as a path through which an etchant used in an etching process of a pixel electrode included in a light-emitting diode may pass. Accordingly, the second conductive layer 403 may be damaged.

For example, as shown in FIG. 7A, a part of the second conductive layer 403 may be damaged to have an opening, and thus, a part of a top surface of the first conductive layer 401 may be exposed. Also, as shown in FIG. 7B, a damaged portion of the second conductive layer 403 may be gradually extended to an adjacent area. As the damaged portion of the second conductive layer 403 is extended, the second conductive layer 403 may be partially disconnected. As such, the damaged portion of the second conductive layer 403 may lead to a defect, such that a part of the pad unit 400 may fail to normally connect a wiring located at (e.g., in or on) the display area to a corresponding pad electrode.

The pad unit 400 according to one or more embodiments of the present disclosure may have a structure in which such defects may be reduced. A structure for reducing defects of the pad unit 400 will be described in more detail with reference to FIGS. 8 through 17. In FIGS. 8 through 17, the same or substantially the same elements and layers as those of one or more embodiments described above are denoted by the same reference symbols, and thus, redundant description thereof may not be repeated hereinafter.

Figure 8:
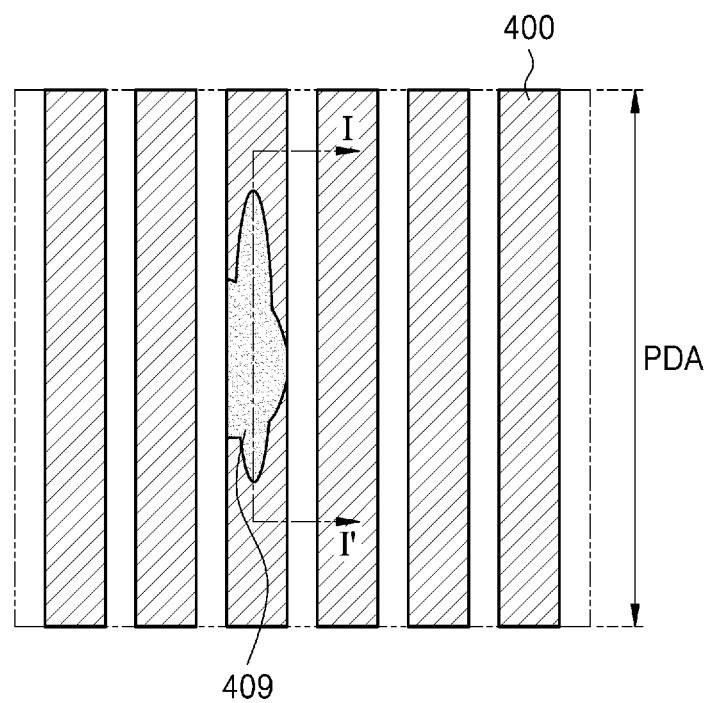
FIG. 8 is a plan view illustrating a part of a pad unit according to an embodiment.
Figure 9:
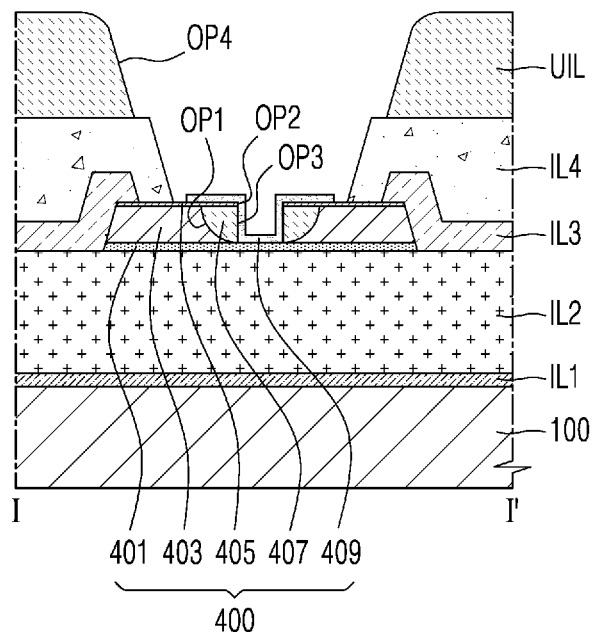
FIG. 9 is a cross-sectional view of the pad unit taken along the line I-I' of FIG. 8.

FIG. 8 is a plan view illustrating a part of the pad unit 400 according to an embodiment. FIG. 9 is a cross-sectional view of the pad unit 400 taken along the line I-I' of FIG. 8. For reference, FIG. 9 is a cross-sectional view illustrating the pad unit 400 having a damaged portion, and a pad unit 400 having no damaged portion may be the same or substantially the same as that of FIG. 5. In other words, a structure of the pad unit 400 described in more detail below with reference to FIGS. 8 to 10 may be selectively applied to ones of the pad units 400 having a damaged portion, and may not be applied to ones of the pad units 400 having no damaged portion, from among the pad units 400.

Referring to FIGS. 8 and 9, the pad unit 400 according to an embodiment may include the first through third conductive layers 401, 403, and 405, an organic protective layer 407, and an additional metal layer 409.

The second conductive layer 403 of the pad unit 400 having a damaged portion from among the pad units 400 may have a first opening OP1, and the third conductive layer 405 may have a second opening OP2 overlapping with the first opening OP1. The first opening OP1 may be generated when the second conductive layer 403 is damaged, and may be a portion through which the first conductive layer 401 under (e.g., underneath) the second conductive layer 403 may be exposed. The second opening OP2 may be generated when the third conductive layer 405 is damaged, and may be a portion through which the second conductive layer 403 under (e.g., underneath) the third conductive layer 405 may be exposed. For example, the second opening OP2 of the third conductive layer 405 may be a pinhole generated during a process. The first opening OP1 of the second conductive layer 403 may be a damaged portion of the second conductive layer 403 exposed through the pinhole. For example, an etchant used in an etching process of a pixel electrode included in a light-emitting diode of a display apparatus may reach the second conductive layer 403 through the second opening OP2 of the third conductive layer 405 to form the first opening OP1 in the second conductive layer 403.

In an embodiment, the area of the second opening OP2 on a top surface of the third conductive layer 405 may be less than the area of the first opening OP1 of the second conductive layer 403 on a top surface of the second conductive layer 403. In other words, an inner surface of the second opening OP2 of the third conductive layer 405 may protrude more toward the center of the second opening OP2 than an inner surface of the first opening OP1 (i.e., formed close to the center of the first opening OP1) of the second conductive layer 403. The 'inner surface of the first opening OP1' may refer to a surface extending from an edge of the top surface of the second conductive layer 403 formed in a direction towards the center of the first opening OP1 to an edge of a bottom surface of the second conductive layer 403, and the 'inner surface of the second opening OP2' may refer to a surface from an edge of the top surface of the third conductive layer 405 formed in a direction towards the center of the second opening OP2 to an edge of a bottom surface of the third conductive layer 405. Accordingly, a space (e.g., a certain space) may be formed between the third conductive layer 405 and the first conductive layer 401. The organic protective layer 407 may fill the space.

The organic protective layer 407 may fill at least a part of the first opening OP1 of the second conductive layer 403. In other words, the organic protective layer 407 may fill at least a part of a damaged portion of the second conductive layer 403. The organic protective layer 407 may prevent or substantially prevent the damaged portion of the second conductive layer 403 from being extended. In more detail, the organic protective layer 407 may prevent or substantially prevent the second conductive layer 403 from being directly exposed to the outside, and thus, may prevent or substantially prevent the damaged portion of the second conductive layer 403 from being extended while reacting to external oxygen and/or moisture during a subsequent process.

In an embodiment, the organic protective layer 407 may be formed along with the upper insulating layer UIL in a process of forming the upper insulating layer UIL. In other words, the organic protective layer 407 may be formed in a process of forming the upper insulating layer UIL, which may be performed after a process of forming the pixel electrode 510. In this case, the organic protective layer 407 may prevent or substantially prevent expansion of damage to the pad unit 400 which may occur in a process of patterning the pixel electrode 510. Also, the organic protective layer 407 may include the same material as a material of the upper insulating layer UIL. For example, the organic protective layer 407 may include an organic material, such as polyimide or hexamethyldisiloxane (HMDSO).

In an embodiment, the organic protective layer 407 may have a third opening OP3 overlapping with the first opening OP1 of the second conductive layer 403 and the second opening OP2 of the third conductive layer 405. The third opening OP3 of the organic protective layer 407 may expose a part of a top surface of the first conductive layer 401 under (e.g., underneath) the organic protective layer 407. An inner surface of the third opening OP3 of the organic protective layer 407 may be continuous with an inner surface of the second opening OP2 of the third conductive layer 405. In other words, there may be no stepped portion between the inner surface of the third opening OP3 of the organic protective layer 407 and the inner surface of the second opening OP2 of the third conductive layer 405. The 'inner surface of the second opening OP2' may refer to a surface extending from an edge of the top surface of the third conductive layer 405 formed in a direction towards the center of the second opening OP2 to an edge of the bottom surface of the third conductive layer 405, and the 'inner surface of the third opening OP3' may refer to a surface extending from an edge of a top surface of the organic protective layer 407 formed in a direction towards the center of the third opening OP3 to an edge of a bottom surface of the organic protective layer 407. The 'inner surface of the fourth opening OP4' may refer to a surface extending from an edge of a top surface of the upper insulating layer UIL formed in a direction towards the center of the fourth opening OP4 to an edge of a bottom surface of the upper insulating layer UIL.

The third conductive layer 405 may cover the top surface of the second conductive layer 403, and the top surface of the organic protective layer 407. Also, the third insulating layer IL3, the fourth insulating layer IL4, and the upper insulating layer UIL located over the third conductive layer 405 may have openings overlapping with the first through third openings OP1, OP2, and OP3. For example, the upper insulating layer UIL may have the fourth opening OP4 overlapping with the first through third openings OP1, OP2, and OP3. Accordingly, at least a part of a top surface of the pad unit 400 may be exposed to the outside, and may be electrically connected to a printed circuit board.

As a portion of the pad unit 400 may be damaged to form the second opening OP2 in the third conductive layer 405 and the first opening OP1 in the second conductive layer 403, the third conductive layer 405 and the second conductive layer 403 may be partially disconnected. In this case, in the damaged portion of the pad unit 400, there may occur a defect that a pad electrode and signal lines located at (e.g., in or on) the display area are not normally connected to each other. Also, as shown in FIG. 9, even when the first conductive layer 401 is not damaged and only the second conductive layer 403 and the third conductive layer 405 are damaged, the performance of the pad unit 400 may be reduced due to an electrical conductivity difference between the conductive layers. For example, when the first conductive layer 401 includes titanium and the second conductive layer 403 includes copper, the electrical conductivity of titanium may be 3.1% of the electrical conductivity of copper. Accordingly, even when only the second conductive layer 403 is disconnected, the performance of the pad unit 400 may be reduced (e.g., may be greatly reduced).

According to one or more embodiments, the pad unit 400 may further include the additional metal layer 409. The additional metal layer 409 may be located on the damaged portion of the pad unit 400, and may electrically connect one side and another side of the damaged portion to each other. For example, the additional metal layer 409 may electrically connect a portion located on one side of the first opening OP1 of the second conductive layer 403 to a portion located on another side of the first opening OP1 of the second conductive layer 403.

In an embodiment, the additional metal layer 409 may cover the top surface of the first conductive layer 401 exposed through the first opening OP1, the inner surface of the second opening OP2, the inner surface of the third opening OP3, and a part of the top surface of the third conductive layer 405. In more detail, as shown in FIGS. 8 and 9, the additional metal layer 409 may be integrally formed to entirely cover the top surface of the first conductive layer 401 exposed through the first opening OP1, the inner surface of the third opening OP3, and the inner surface of the second opening OP2, and to cover at least a part of an edge portion of the second opening OP2 on the top surface of the third conductive layer 405. A planar shape of the additional metal layer 409 is not limited to the shape illustrated in FIG. 8, and may be variously modified according to a shape of the damaged portion of the pad unit 400, for example, according to a shape of the first opening OP1 or a shape of the second opening OP2.

The additional metal layer 409 may include silver (Ag) or tungsten (W).

Figure 10:
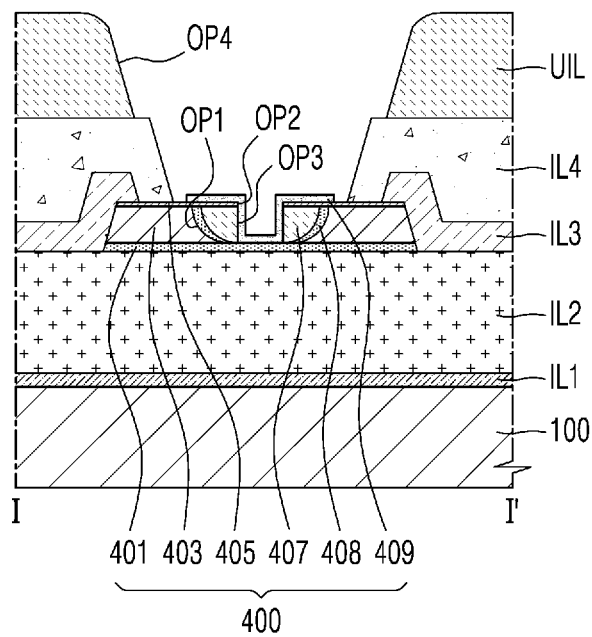
FIG. 10 is a cross-sectional view illustrating a part of a pad unit according to an embodiment.

FIG. 10 is a cross-sectional view illustrating a part of the pad unit 400 according to an embodiment.

For reference, when compared to FIG. 9, FIG. 10 may be different in that the pad unit 400 may further include a delay film 408. Accordingly, the differences between the embodiments of FIGS. 9 and 10 may be mainly described in more detail hereinafter, and redundant description thereof may not be repeated.

The delay film 408 may be located between the organic protective layer 407 and the second conductive layer 403. In more detail, the delay film 408 may be located between the organic protective layer 407 and the second conductive layer 403 to surround (e.g., around a periphery of) the organic protective layer 407. The delay film 408 may prevent or substantially prevent a damaged portion of the second conductive layer 403 from being extended. In more detail, the delay film 408 may more effectively delay corrosion of a metal material included in the second conductive layer 403. For example, the damaged portion of the second conductive layer 403 may be firstly blocked from the outside by the delay film 408, and may be secondly blocked from the outside by the organic protective layer 407.

In an embodiment, the delay film 408 may be formed as a component of the organic protective layer 407 when a metal included in the second conductive layer 403 reacts with the organic protective layer 407 at (e.g., in or on) a contact surface between the organic protective layer 407 and the second conductive layer 403. In more detail, a sulfur component included in the organic protective layer 407 and the metal included in the second conductive layer 403 may react to each other to form the delay film 408. In this case, the delay film 408 may include a combination of the sulfur component and the metal included in the second conductive layer 403. For example, when the second conductive layer 403 includes copper, the delay film 408 may include copper sulfide formed when sulfur (S) reacts to copper. In this case, the copper sulfide may be a sulfur compound composed of copper ions and sulfur ions, but the present disclosure is not limited thereto. Various examples of the copper sulfide may include copper(I) sulfide (cuprous sulfide) and copper(II) sulfide (cupric sulfide).

FIGS. 11 through 17 are cross-sectional views sequentially illustrating various processes of a method of manufacturing a display apparatus according to an embodiment. For reference, a pad unit 400 having a damaged portion from among the pad units 400 is illustrated in FIGS. 13 through 17. According to an embodiment, the pad units 400 having no damaged portions may not be subjected to the processes performed on the pad unit 400 shown in FIGS. 13 through 17. In other words, the processes performed on the pad unit 400 shown in FIGS. 13 to 17 may be selectively performed, for example, on only the pad unit 400 having a damaged portion from among the pad units 400.

Figure 11:
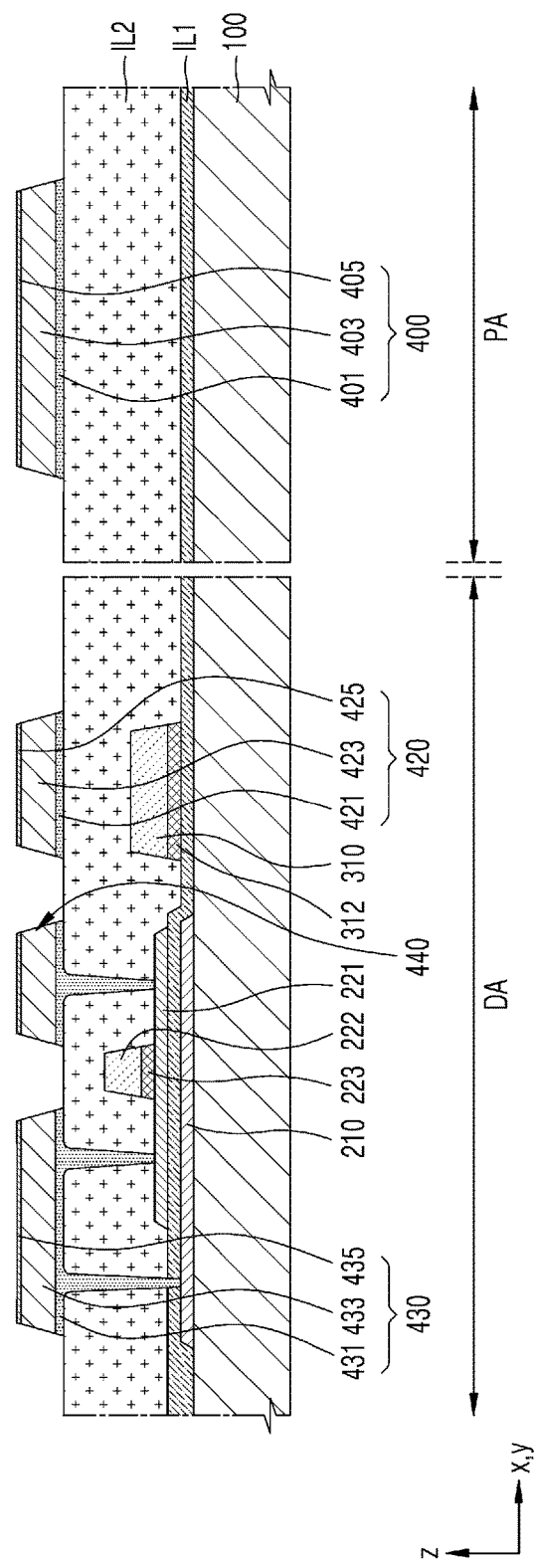
FIGS. 11-17 are cross-sectional views sequentially illustrating various processes of a method of manufacturing a display apparatus according to an embodiment.

As shown in FIG. 11, the thin-film transistors and the storage capacitor located at (e.g., in or on) the display area DA of the substrate 100, and the pad units 400 located at (e.g., in or on) the peripheral area PA of the substrate 100, are formed. The pad unit 400 may include the first conductive layer 401 located over the substrate 100, the second conductive layer 403 located on the first conductive layer 401, and the third conductive layer 405 located on the second conductive layer 403.

The pad unit 400, the source electrode 430 and the drain electrode 440 of the thin-film transistor, and the second electrode 420 of the storage capacitor may be concurrently (e.g., simultaneously) formed in the same process. In more detail, a layer including a material of the first conductive layer 401, a layer including a material of the second conductive layer 403, and a layer including a material of the third conductive layer 405 may be sequentially formed on an entire surface of the substrate 100, and may be patterned to form the pad unit 400, the source electrode 430 and the drain electrode 440 of the thin-film transistor, and the second electrode 420 of the storage capacitor. Accordingly, edges of the first through third conductive layers 401, 403, and 405 included in the pad unit 400 may be aligned with one another. Also, edges of the first through third layers included in the source electrode 430 and the drain electrode 440 of the thin-film transistor may be aligned with one another, and edges of the first through third layers 421 to 425 included in the second electrode 420 of the storage capacitor may be aligned with one another.

Figure 12:
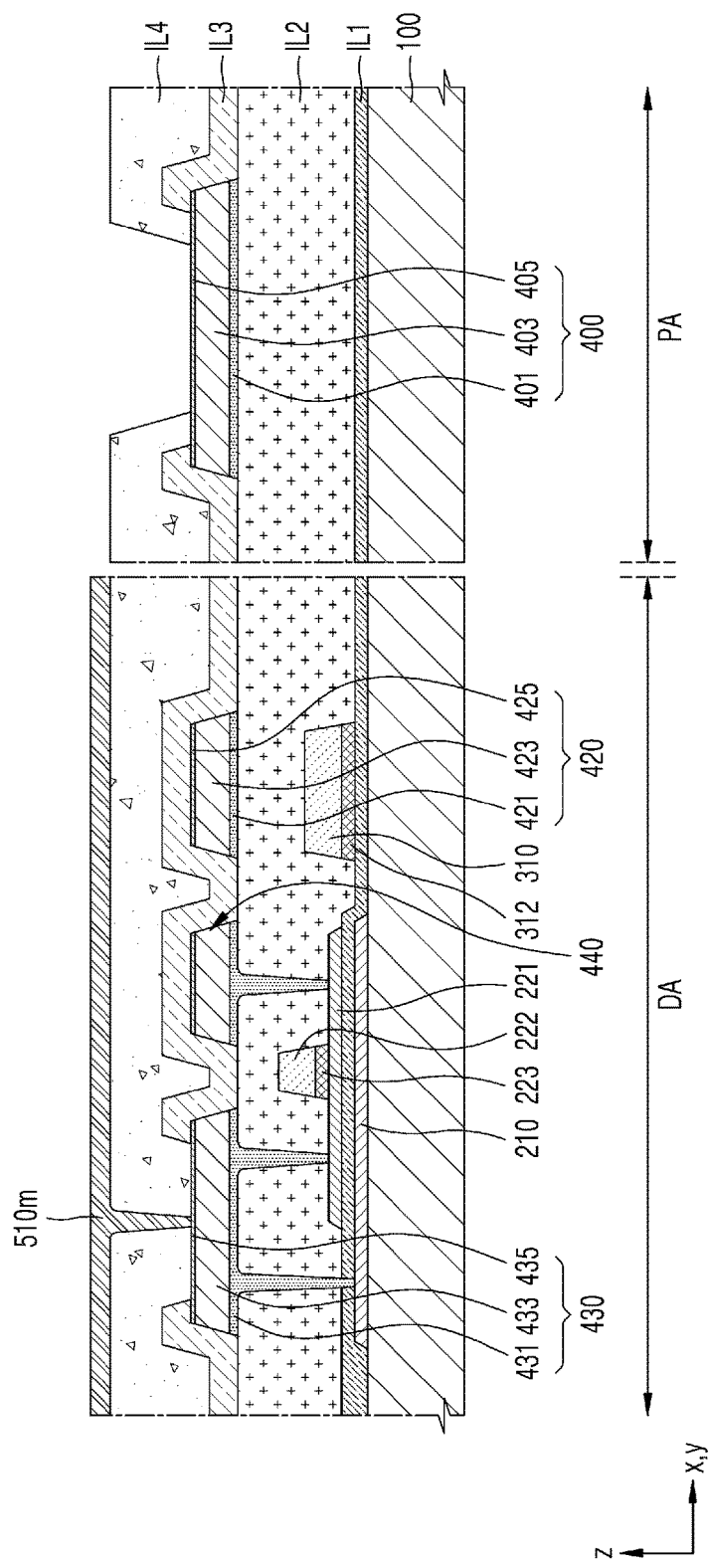
Figure 13:
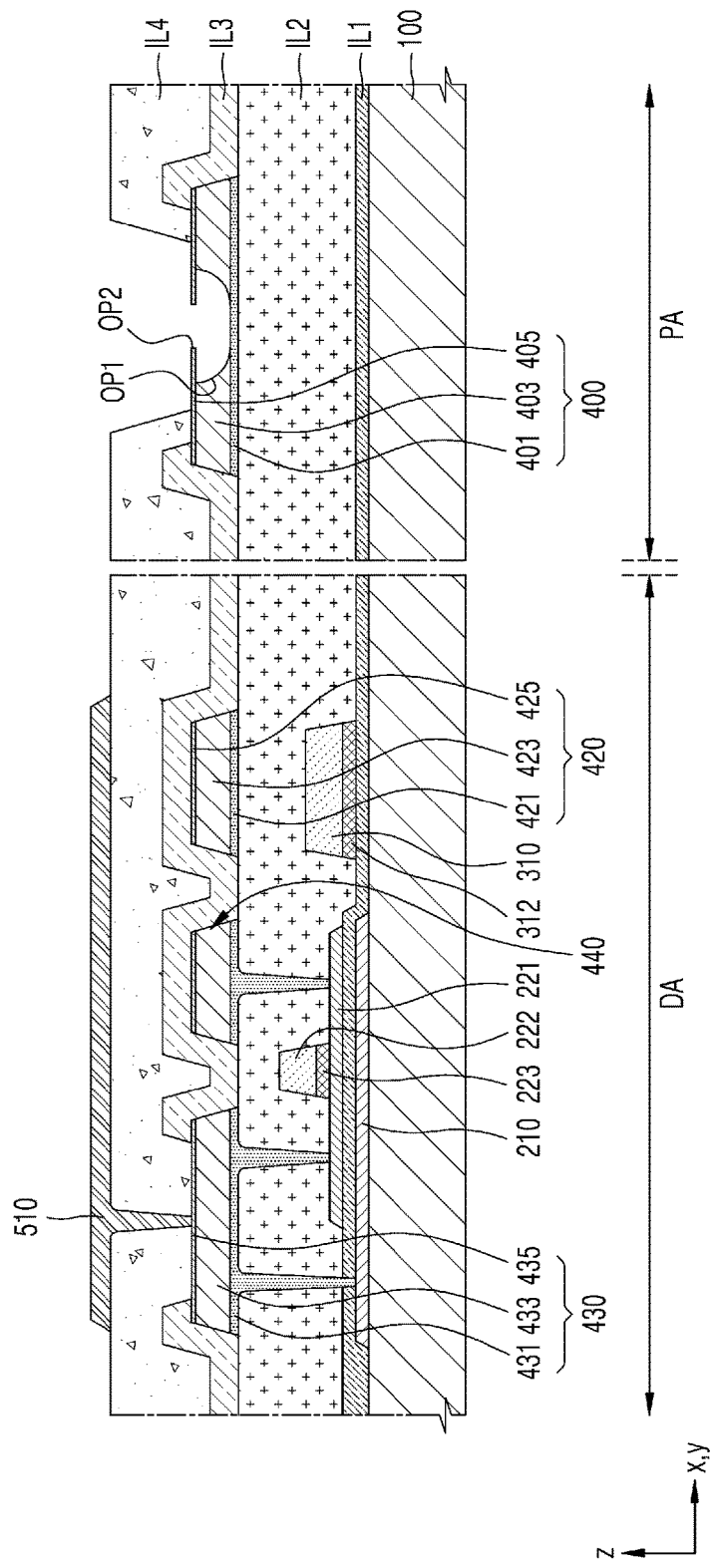

As shown in FIGS. 12 and 13, a pixel electrode material layer 510m is formed on the thin-film transistors, and may be patterned to form the pixel electrode 510.

As described above, while a process of patterning the pixel electrode material layer 510m is performed, a part of the pad unit 400 may be damaged. In more detail, a part of the second conductive layer 403 of the pad unit 400 may be damaged by an etchant provided to pattern the pixel electrode material layer 510m, such that the first opening OP1 in the second conductive layer 403 may be formed. The etchant may reach the second conductive layer 403 through the second opening OP2 of the third conductive layer 405, and the second opening OP2 may be formed before the process of patterning the pixel electrode material layer 510m.

Figure 14:
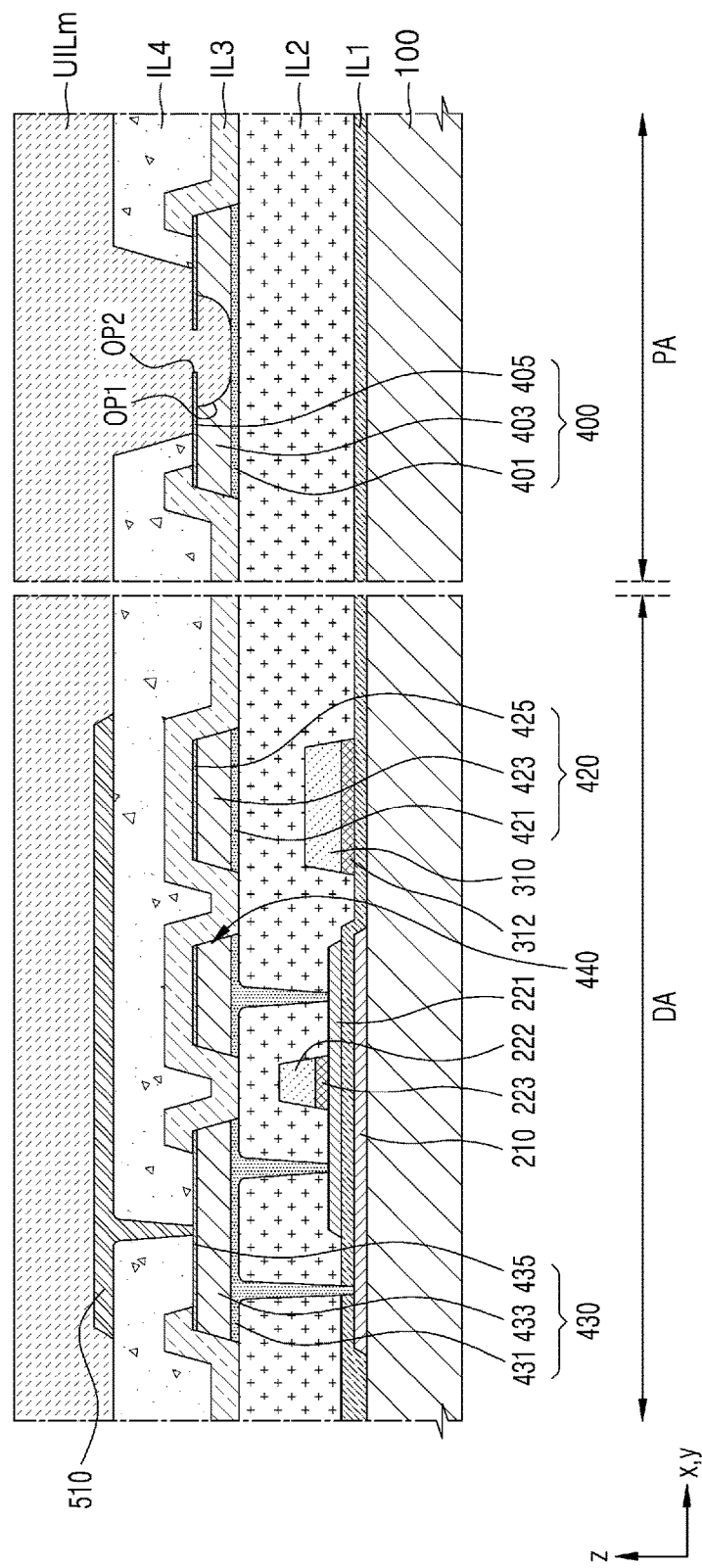

As shown in FIG. 14, an organic material layer UILm is formed entirely over the substrate 100. The organic material layer UILm covers the pixel electrode 510 at (e.g., in or on) the display area DA of the substrate 100. Also, the organic material layer UILm fills the first opening OP1 and the second opening OP2 in the pad unit 400 having the damaged portion from among the pad units 400 at (e.g., in or on) the peripheral area PA of the substrate 100.

The organic material layer UILm may be a layer that is patterned into the upper insulating layer UIL and the organic protective layer 407 in a subsequent process. Accordingly, the upper insulating layer UIL and the organic protective layer 407 may be concurrently (e.g., simultaneously) patterned in the same process, and may include the same material as each other.

Figure 15:
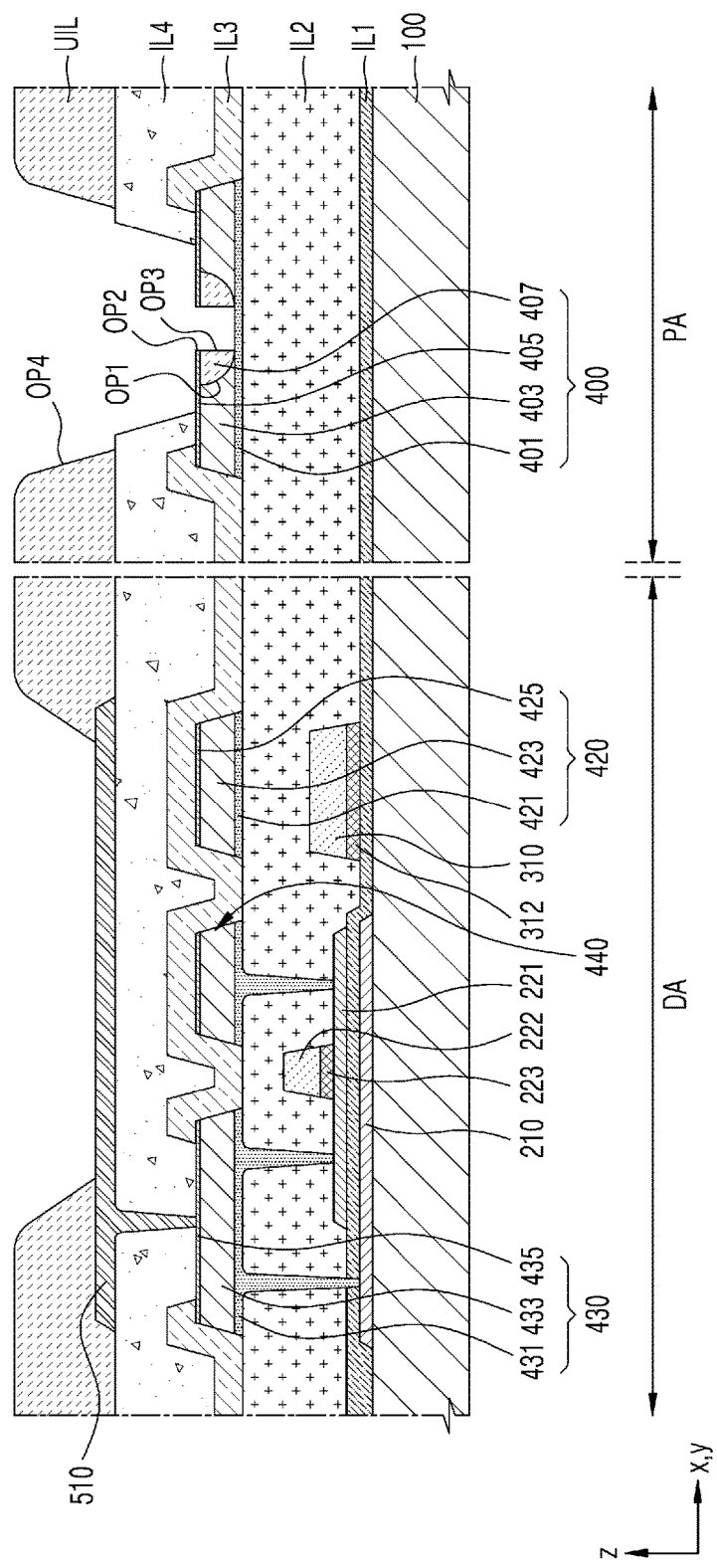

As shown in FIG. 15, the organic material layer UILm is patterned to form the upper insulating layer UIL having the pixel opening through which the central portion of the pixel electrode 510 is exposed, and the fourth opening OP4 overlapping with the first opening OP1.

In an embodiment, a portion of the organic material layer UILm filling the first opening OP1 may be concurrently (e.g., simultaneously) patterned in the process of patterning the organic material layer UILm. In more detail, the third opening OP3 overlapping with the first opening OP1 and the second opening OP2 may be formed in the organic protective layer 407. For example, in the process of patterning the organic material layer UILm, a portion of the organic material layer UILm filling the first opening OP1 and not covered by the third conductive layer 405 may be removed. Accordingly, an inner surface of the third opening OP3 of the organic protective layer 407 may be continuous with an inner surface of the second opening OP2 of the third conductive layer 405. In other words, there may be no stepped portion between the inner surface of the third opening OP3 of the organic protective layer 407 and the inner surface of the second opening OP2 of the third conductive layer 405.

Figure 16:
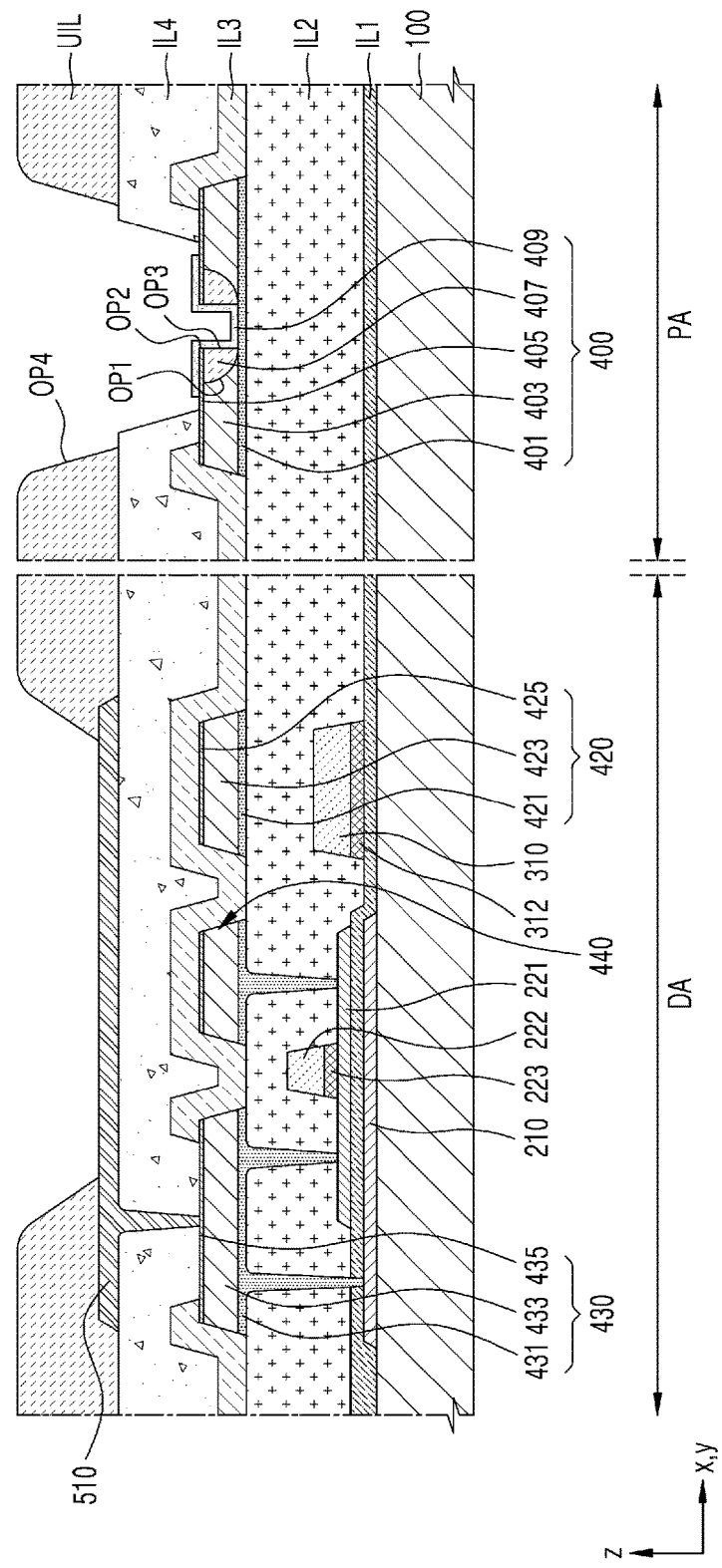

As shown in FIG. 16, the additional metal layer 409 is formed on the pad unit 400 having the damaged portion from among the pad units 400. The additional metal layer 409 may continuously cover a top surface of the first conductive layer 401 that is exposed through the first opening OP1, the inner surface of the second opening OP2, the inner surface of the third opening OP3, and a part of a top surface of the third conductive layer 405.

In an embodiment, the additional metal layer 409 may be formed by forming a metal material layer by using chemical vapor deposition (CVD) or sputtering, and then patterning the metal material layer to be located at (e.g., in or on) only the damaged portion of the pad unit 400. For example, a process of patterning the metal material layer into the additional metal layer 409 may be a photolithography process using a mask having a pattern corresponding to the additional metal layer 409. However, the present disclosure is not limited thereto, and the additional metal layer 409 may be formed by using various suitable methods.

Figure 17:
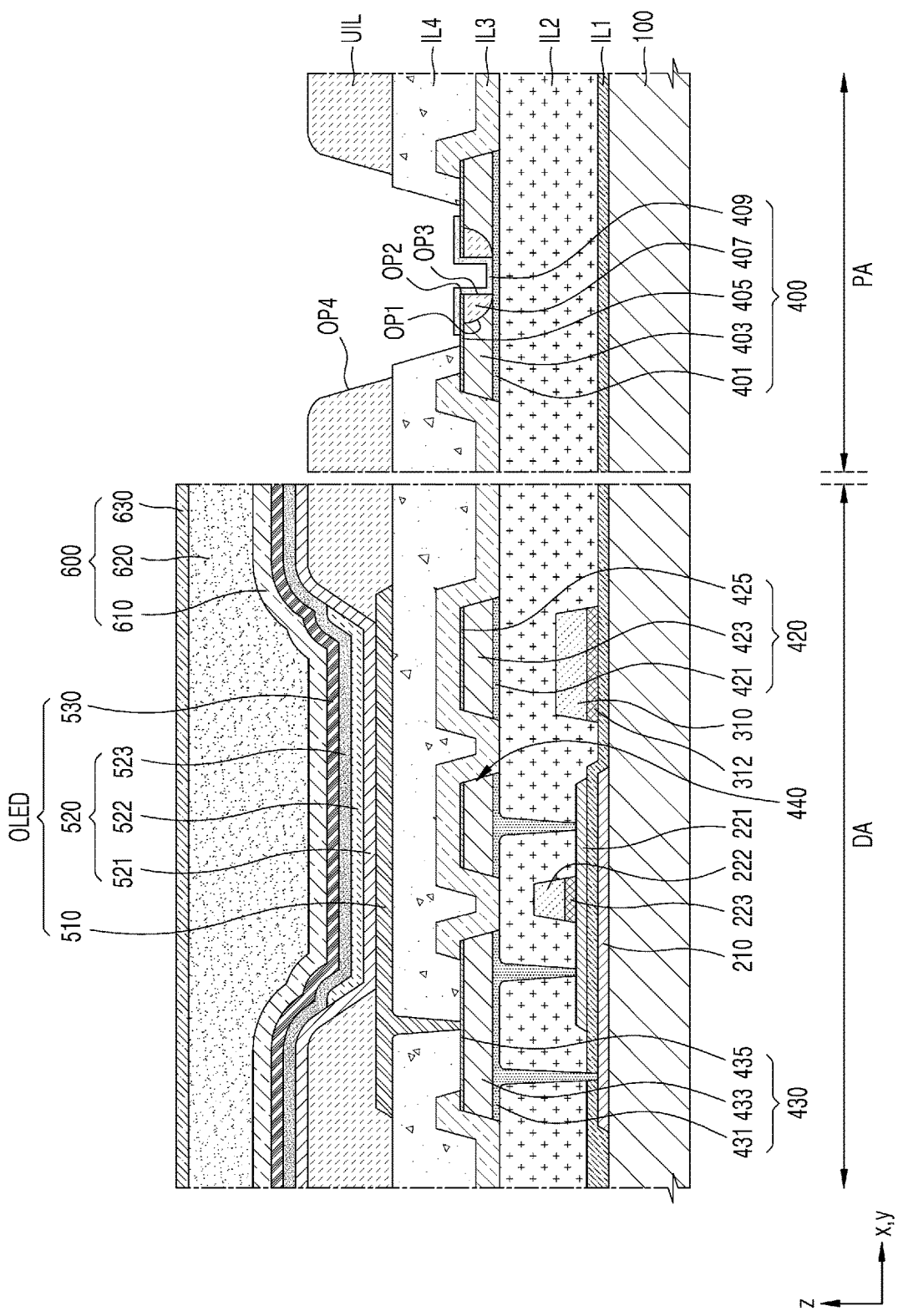

As shown in FIG. 17, the intermediate layer 520, the counter electrode 530, and the encapsulation layer 600 may be formed at (e.g., in or on) the display area DA of the substrate 100.

At (e.g., in or on) a contact portion between the organic protective layer 407 and the second conductive layer 403, the organic protective layer 407 and the second conductive layer 403 may react to each other to form the delay film 408 (e.g., see FIG. 10) between the organic protective layer 407 and the second conductive layer 403. A time at which the delay film 408 is formed is not specifically limited, and the formation of the delay film 408 may be completed at any time in a manufacturing process after the organic material included in the organic material layer UILm and the second conductive layer 403 contact each other. In more detail, a component included in the organic material layer UILm and a metal included in the second conductive layer 403 may begin to react to each other at (e.g., in or on) a contact portion between the organic material layer UILm and the second conductive layer 403 after the organic material layer UILm fills the first opening OP1, and the formation of the delay film 408 may be completed when the curing of the organic material layer UILm is completed.

According to the one or more embodiments of the present disclosure, a display apparatus including a pad unit (e.g., a pad terminal) having reduced defects, and a method of manufacturing the display apparatus may be provided. However, the present disclosure is not limited to such aspects and features.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display apparatus comprising:
   a substrate comprising a display area, and a peripheral area; and
   a pad unit at the peripheral area, the pad unit comprising:
      a first conductive layer;
      a second conductive layer on the first conductive layer, and having a first opening;
      a third conductive layer on the second conductive layer, and having a second opening overlapping with the first opening, the second opening having an area less than an area of the first opening at a top surface of the second conductive layer;
      an organic protective layer filling the first opening, and having a third opening overlapped by the second opening; and
      an additional metal layer covering a top surface of the first conductive layer exposed through the first opening, an inner surface of the second opening, an inner surface of the third opening, and a portion of a top surface of the third conductive layer.

2. The display apparatus of claim 1, wherein the inner surface of the second opening protrudes farther toward a center of the second opening than an inner surface of the first opening.

3. The display apparatus of claim 1, wherein the pad unit further comprises a delay film between the organic protective layer and the second conductive layer.

4. The display apparatus of claim 3, wherein the delay film comprises a combination of sulfur and a metal included in the second conductive layer.

5. The display apparatus of claim 4, wherein the second conductive layer comprises copper, and the delay film comprises copper sulfide.

6. The display apparatus of claim 1, wherein the first conductive layer, the second conductive layer, and the third conductive layer extend in one direction.

7. The display apparatus of claim 6, wherein an outer edge of the first conductive layer, an outer edge of the second conductive layer, and an outer edge of the third conductive layer are aligned with one another.

8. The display apparatus of claim 1, further comprising a plurality of thin-film transistors at the display area, each of the plurality of thin-film transistors comprising a source electrode, and a drain electrode,
wherein each of the source electrode and the drain electrode comprises a first layer comprising a same material as a material of the first conductive layer, a second layer comprising a same material as a material of the second conductive layer, and a third layer comprising a same material as a material of the third conductive layer.

9. The display apparatus of claim 8, wherein the first conductive layer comprises titanium, the second conductive layer comprises copper, and the third conductive layer comprises indium tin oxide (ITO).

10. The display apparatus of claim 1, wherein no stepped portion is between the inner surface of the second opening and the inner surface of the third opening.

11. The display apparatus of claim 1, further comprising:
a pixel electrode at the display area; and
an upper insulating layer on the pixel electrode, and having a pixel opening exposing a central portion of the pixel electrode, and a fourth opening overlapping with the first opening.

12. The display apparatus of claim 11, wherein the organic protective layer comprises a same material as a material of the upper insulating layer.

13. The display apparatus of claim 1, wherein the additional metal layer electrically connects a portion of the second conductive layer located at one side of the first opening to a portion of the second conductive layer located at another side of the first opening.

14. The display apparatus of claim 1, wherein the additional metal layer comprises silver or tungsten.

* * * * *